United States Patent
Shirakawa et al.

(10) Patent No.: US 7,436,905 B2
(45) Date of Patent: Oct. 14, 2008

(54) RECEIVER DEVICE, COMMUNICATIONS DEVICE, WIRELESS LAN DEVICE, POWER CONTROL METHOD FOR A RECEIVER DEVICE, POWER CONTROL PROGRAM FOR A RECEIVER DEVICE, AND STORAGE MEDIUM

(75) Inventors: Atsushi Shirakawa, Chiba (JP); Tetsuo Ueno, Funabashi (JP); Takamitsu Kitayama, Chiba (JP)

(73) Assignee: Sharp Kabushiki Kaisha, Osaka (JP)

( * ) Notice: Subject to any disclaimer, the term of this patent is extended or adjusted under 35 U.S.C. 154(b) by 624 days.

(21) Appl. No.: 10/918,418

(22) Filed: Aug. 16, 2004

(65) Prior Publication Data
US 2006/0002495 A1    Jan. 5, 2006

Related U.S. Application Data (60) Provisional application No. 60/587,514, filed on Jul. 14, 2004.

(30) Foreign Application Priority Data
Jul. 5, 2004    (JP) .............................. 2004-198605

(51) Int. Cl.
H04L 27/00    (2006.01)
(52) U.S. Cl. .................................... 375/316
(58) Field of Classification Search ................ 375/259, 375/316, 345; 370/311, 337, 347; 455/13.4, 455/572, 574, 127.1, 127.5, 343.5
See application file for complete search history.

(56) References Cited

U.S. PATENT DOCUMENTS
6,463,050 B1 * 10/2002 Nagashima ................ 370/347

2004/0235445 A1 * 11/2004 Gomez ........................ 455/307
2006/0031457 A1 *  2/2006 Motoyama ................. 709/224

FOREIGN PATENT DOCUMENTS

| JP | 2-72724 A | 3/1990 |
|----|-----------|--------|
| JP | 8-307428 | 11/1996 |
| JP | 2000-236286 A | 8/2000 |
| JP | 2001-218129 A | 8/2001 |
| JP | 2002-33673 A | 1/2002 |
| JP | 2002-135151 A | 5/2002 |

OTHER PUBLICATIONS

Cai et al. AGC and IF amplifier circuits design, 2003 IEEE Topical Conference on Wirless communication Technology, p. 42-46.*

* cited by examiner

*Primary Examiner*—Sam K Ahn
(74) *Attorney, Agent, or Firm*—Birch, Stewart, Kolasch & Birch, LLP (57) ABSTRACT

A receiver device in accordance with the present invention (for example, wireless LAN device) includes: a radio frequency signal processor section converting an incoming radio frequency signal to a lower frequency; an RSSI circuit (reception strength sensor section) sensing the signal strength of the radio frequency signal; an intermediate frequency signal processor section converting a signal from the radio frequency signal processor section to an even lower frequency; a digital demodulator section (demodulator section) demodulating a signal from the intermediate frequency signal processor section; and a power control circuit controlling power supply to circuits in the intermediate frequency signal processor section which makes up part of the analog section (AGC circuit, IF mixer circuit, LPF circuit, and amplifier circuit) according to a result of sensing by the RSSI circuit. The structure provides a power saving receiver device.

22 Claims, 6 Drawing Sheets

RECEIVER DEVICE, COMMUNICATIONS DEVICE, WIRELESS LAN DEVICE, POWER CONTROL METHOD FOR A RECEIVER DEVICE, POWER CONTROL PROGRAM FOR A RECEIVER DEVICE, AND STORAGE MEDIUM

This Nonprovisional application claims priority under 35 U.S.C. § 119(a) on Patent Application No. 2004-198605 filed in Japan on Jul. 5, 2004 and Provisional Patent Application No. 60/587,514 filed in the U.S., the entire contents of which are hereby incorporated by reference.

FIELD OF THE INVENTION

The present invention relates to power savings in receiver devices for, among others, double heterodyne or direct conversion wireless LAN terminals.

BACKGROUND OF THE INVENTION

Figure 6:
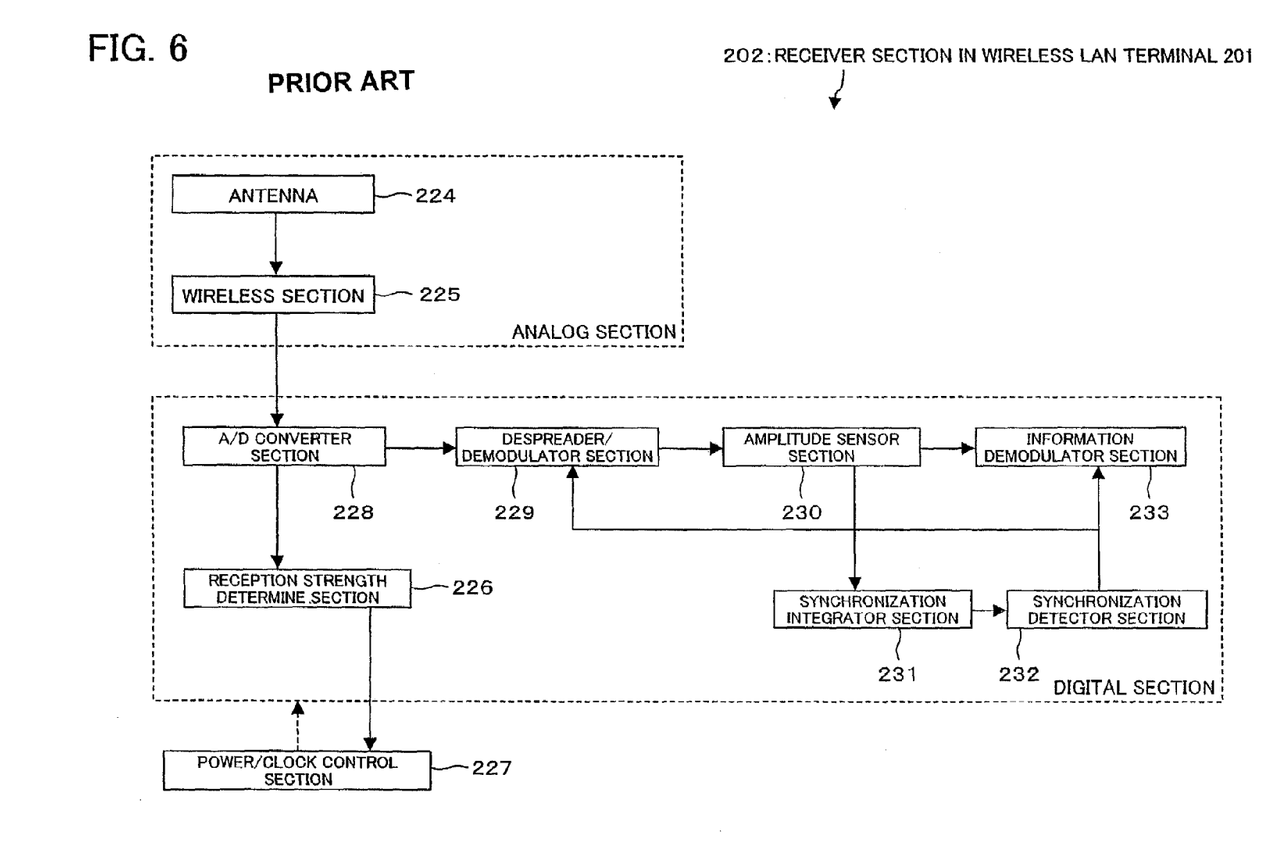
FIG. 6 is a block diagram showing an arrangement of a conventional (power saving) wireless LAN device.

FIG. 6 is a block diagram showing a conventional power saving structure for the wireless LAN device disclosed in Japanese unexamined patent application 8-307428 (Tokukaihei 8-307428/1996; published on 22 Nov. 1996). A receiver section 202 in the conventional wireless LAN device 201 includes: a radio section 225 which makes up the analog section; and a reception strength determine section 226, a power/clock control section 227, an A/D converter section 228, a despreader/demodulator section 229, an amplitude sensor section 230, a synchronization integrator section 231, a synchronization detector section 232, and an information demodulator section 233 which make up a digital section.

The radio section 225 operates in the analog domain. The section 225 produces an intermediate frequency from an RF (radio frequency) signal received by an antenna 224 with an internal amplifier and filter, to obtain a necessary reception strength. The reception strength determine section 226 amplifies, rectifies, and smoothes the intermediate frequency signal and compares the resultant signal strength to a predetermined value with an internal comparator to determine whether to start reception. The power/clock control section 227 controls power and clock supply to each block. The A/D converter section 228 converts the output of the radio section 225 from analog to digital. The despreader/demodulator section 229 demodulates a spread signal by despreading. The amplitude sensor section 230 produces a value indicating the amplitude of the output of the despreader/demodulator section 229. The synchronization integrator section 231 integrates the output of the amplitude sensor section 230 for each symbol. The synchronization detector section 232 produces a synchronization signal from the output of the synchronization integrator section 231. The information demodulator section 233 demodulates for information based on the output of the amplitude sensor section 230 and the synchronization signal output of the synchronization detector section 232.

Now, the receiver section 202 in the wireless LAN device 201 will be described in terms of its operation.

In reception standby periods, only the radio section 225 (analog section), the reception strength determine section 226, and the power/clock control section 227 are in operation. The power/clock control section 227, in the reception standby period, is suspending operation clock supply to the A/D converter section 228, the despreader/demodulator section 229, the amplitude sensor section 230, the synchronization integrator section 231, the synchronization detector section 232, and the information demodulator section 233 which therefore are not operating.

In these circumstances, the reception strength determine section 226 amplifies the intermediate frequency signal from the radio section 225 and compares the strength of the intermediate frequency signal to a value specified by the terminal device with an internal comparator. If the strength of the intermediate frequency signal is greater, reception is started.

Following the start of reception, the power/clock control section 227 supplies an operation clock to the A/D converter section 228, the despreader/demodulator section 229, the amplitude sensor section 230, the synchronization integrator section 231, the synchronization detector section 232, and the information demodulator section 233 to place them in operation.

After a termination of reception, only the radio section 225 (analog section), the reception strength determine section 226, and the power/clock control section 227 are again in operation.

The structure lowers power consumption in the wireless LAN device which stands by for an extended period of time for reception.

However, in this conventional structure, in reception standby periods when the digital section (A/D converter section 228, despreader/demodulator section 229, amplitude sensor section 230, synchronization integrator section 231, synchronization detector section 232, and information demodulator section 233) is not operating, the radio section 225 (analog section) is in operation. The radio section 225 includes various analog circuits which, when combined, consume quite a lot of operating power. This waste of power cannot be ignored, especially, when the wireless LAN device is mounted to a mobile terminal.

SUMMARY OF THE INVENTION

The present invention, in view of these problems, has an objective to provide a receiver device (for example, wireless LAN device) capable of power savings.

A receiver device in accordance with the present invention, to address these issues, includes:

a first signal processor section converting an incoming radio frequency signal to a lower frequency;

a reception strength sensor section sensing a signal strength of the radio frequency signal;

a second signal processor section carrying out a process on a signal from the first signal processor section to improve demodulation precision;

a demodulator section demodulating a signal from the second signal processor section; and a power control section controlling power supply to circuits in the second signal processor section according to a result of sensing by the reception strength sensor section.

According to the arrangement, the first signal processor section converts an incoming radio frequency signal to a lower frequency (for example, baseband signal). Meanwhile, the reception strength sensor section senses the signal strength of the incoming radio frequency signal.

The output signal from the first signal processor section is processed (for example, auto gain control and amplification) in the second signal processor section for better demodulation precision. The output signal from the second signal processor section is demodulated in the demodulator section to reproduce transmitted information.

The power control section controls power supply to the circuits in the second signal processor section according to the result of the sensing by the reception strength sensor section. For example, power supply to the second signal processor section is suspended until the result of the sensing by the reception strength sensor section meets a predetermined condition. As a result, unlike conventional art where the entire analog section is always powered and kept in operation (see FIG. 6), power waste in the second signal processor section is greatly reduced while the analog section is waiting for a signal to be received (demodulatable signal) (during reception standby). The arrangement thus achieves power savings in the receiver device.

Another receiver device in accordance with the present invention, to address the issues, includes:

a radio frequency signal processor section converting an incoming radio frequency signal to a lower frequency;

a reception strength sensor section sensing a signal strength of the radio frequency signal;

an intermediate frequency signal processor section converting a signal from the radio frequency signal processor section to an even lower frequency;

a demodulator section demodulating a signal from the intermediate frequency signal processor section; and a power control section controlling power supply to circuits in the intermediate frequency signal processor section according to a result of sensing by the reception strength sensor section.

According to the arrangement, the radio frequency signal processor section converts an incoming radio frequency signal to a lower frequency (for example, intermediate frequency signal). The signal output of the radio frequency signal processor section is converted in the intermediate frequency signal processor section to an even lower frequency (for example, baseband signal). Meanwhile, the reception strength sensor section senses the signal strength of the incoming radio frequency signal. The output signal from the intermediate frequency signal processor section is fed to the demodulator section for demodulation to reproduce transmitted information.

The power control section controls power supply to the circuits in the intermediate frequency signal processor section according to the result of the sensing by the reception strength sensor section. For example, power supply to the intermediate frequency signal processor section is suspended until the result of the sensing by the reception strength sensor section meets a predetermined condition. As a result, unlike conventional art where the entire analog section is always powered and kept in operation (see FIG. 6), power waste in the intermediate frequency signal processor section is greatly reduced while the analog section is waiting for a signal to be received (demodulatable signal) (during reception standby). The arrangement thus achieves power savings in the receiver device.

DESCRIPTION OF THE EMBODIMENTS

Embodiment 1

Figure 3:
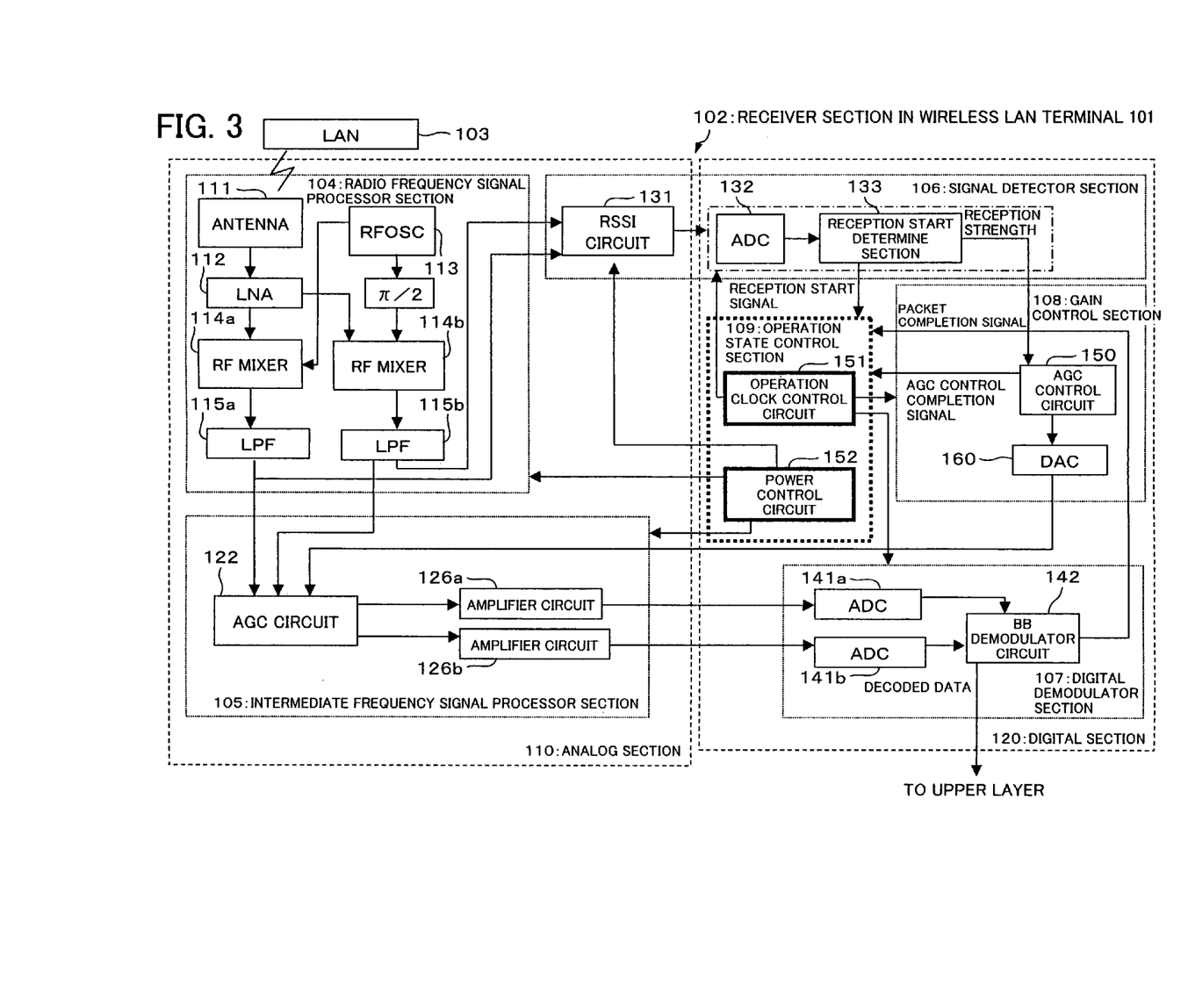
FIG. 3 is a block diagram showing an arrangement of a wireless LAN terminal (receiver section) in accordance with embodiment 2 of the present invention.
Figure 4:
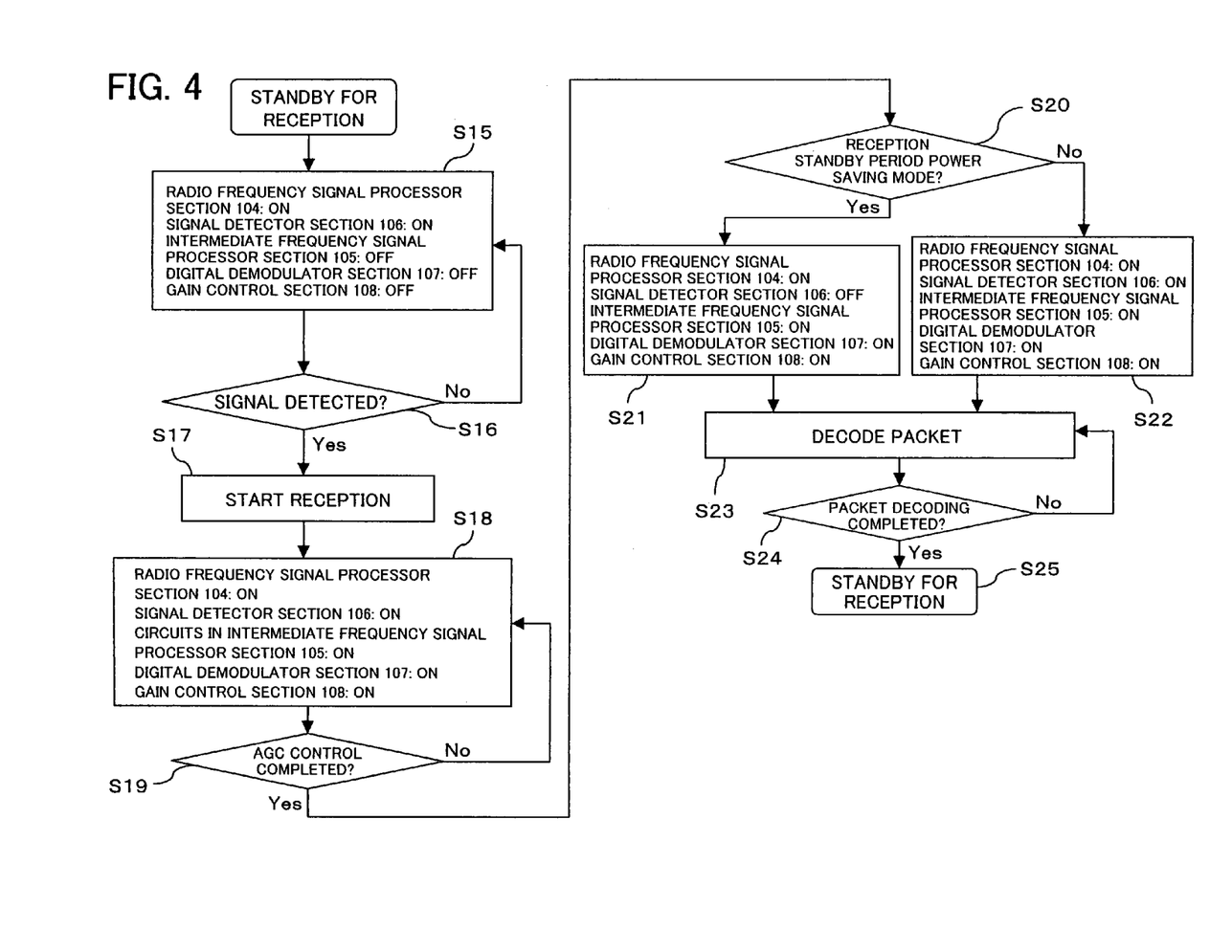
FIG. 4 is a flow chart illustrating the control the operation state of the wireless LAN terminal in FIG. 3.

Referring to FIGS. 3, 4, the following will describe another embodiment in accordance with the wireless LAN terminal (receiver device, wireless LAN device) of the present invention.

As shown in the figures, a receiver section 102 in a wireless LAN terminal 101 in accordance with the present embodiment has a direct conversion structure composed chiefly of a radio frequency signal processor section (first signal processor section) 104, a signal detector section 106, a gain regulator section (second signal processor section) 105, a digital demodulator section (demodulator section) 107, a gain control section 108, and an operation state control section 109.

The radio frequency signal processor section 104, the gain regulator section 105, and a part of the signal detector section 106 (RSSI circuit 131) make up an analog section 110. Another part of the signal detector section 106 (ADC 132, reception start determine section 133), the digital demodulator section 107, the gain control section 108, and the operation state control section 109 make up a digital section 120.

The radio frequency signal processor section 104 includes an antenna 111, a low noise amplifier (LNA) 112, a radio frequency oscillator (RFOSC) 113, two radio frequency mixers (RF mixers) 114a, 114b, and two low pass filters (LPFs) 115a, 115b. The antenna 111 receives a radio frequency signal (RF signal) from a LAN (local area network) 103 between which and the wireless LAN terminal 101 is established a wireless link. The low noise amplifier 112 amplifies the radio signal 111 received by the antenna 111 at a low NF (noise figure) before feeding the signal to both the radio frequency mixers (RF mixers) 114a, 114b. The radio frequency oscillator 113 oscillates to generate a signal which is used in down converting the radio frequency signal to a baseband signal. The radio frequency mixer 114a mixes one of the signal outputs of the low noise amplifier 112 with an oscillating signal from the radio frequency oscillator 113 to produce a baseband signal (in-phase component) output. The radio frequency mixer 114b mixes the other signal output of the low noise amplifier 112 with the oscillating signal from the radio frequency oscillator 113 after a π/2 phase-shifting of the oscillating signal, to produce a baseband signal (quadrature component) output. The low pass filter 115a removes unnecessary components from the baseband signal (in-phase component) output of the radio frequency mixer 114a to generate a signal at a target frequency. The low pass filter 115b removes unnecessary components from the baseband signal (quadrature component) output of the radio frequency mixer 114b to generate a signal at a target frequency.

The gain regulator section 105 include an AGC circuit (auto gain control circuit, gain regulator circuit) 122 and two amplifier circuits (AMP circuits) 126a, 126b. The amplifier circuit 126a amplifies the output of the low pass filter circuit 115a which is the baseband signal (in-phase component) minus unnecessary components. The amplifier circuit 126b amplifies the output of the low pass filter circuit 115b which is the baseband signal (quadrature component) minus unnecessary components.

The signal detector section 106 includes the RSSI (receive signal strength indicator) circuit (reception strength sensor section) 131 which makes up part of the analog section 110; and the A/D converter (ADC) 132 and the reception start determine section 133 which make up part of the digital section 120. The RSSI circuit 131 generates an RSSI signal from the baseband signal output of the lowpass filter 115 for output to the A/D converter 132. The A/D converter 132 then digitizes the RSSI signal detected in the RSSI circuit 131 for output to the reception start determine section 133. The structure of the reception start determine section 133 and the scheme to determine whether to start reception are similar to embodiment 1 (see FIG. 5). In short, when an increase in the RSSI value from the RSSI circuit 131 (the result of sensing by the reception strength sensor section) is greater than a threshold increase value (when the increase meets a predetermined condition), a signal is determined to have been detected, and a reception start signal is sent to the operation state control section 109. The reception start determine section 133 supplies the RSSI value as indicating the reception strength to the gain control section 108. By making a decision to start reception based on a sample value increase exceeding a threshold value in this manner, the targeted incoming signal is not missed in the input which may include both the target signal and interference signals. A reception start is accurately determined.

The reference does not necessarily provided by the delay circuit, but may be provided by a sample and hold circuit which samples the RSSI signal and holds the value at certain times. The reception start determine section 133 may include a simple arrangement to determine whether the reception strength output of the A/D converter 132 (the result of sensing by the reception strength sensor section) exceeds a threshold value (predetermined level) and if so, supply a reception start signal to the operation state control section 109.

The digital demodulator section 107 includes two ADCs (A/D converters) 141a, 141b and a BB (baseband) demodulator circuit 142. The A/D converter 141a converts the baseband signal from the amplifier circuit 126a from analog to digital. Similarly, the A/D converter 141b converts the baseband signal from the amplifier circuit 126b from analog to digital. The baseband demodulator circuit 142 demodulates the digital signal outputs of the A/D converters 141a, 141b to reproduce original data (transmitted information) for output to an upper layer. Having completed the signal (packet data) demodulation, the baseband demodulator circuit 142 sends a packet terminate signal to the operation state control section 109.

The gain control section 108 includes an AGC control circuit 150 and a DAC (D/A converter) 160. The AGC control circuit 150 controls the AGC circuit 122 according to the reception strength output of the reception start determine section 133. Having completed the control of the AGC circuit 122, the AGC control circuit 150 sends an AGC control completion signal to the operation state control section 109.

The operation state control section 109 includes an operation clock control circuit (digital operation control section) 151 and a power control circuit (power control section) 152. In response to a reception start signal from the reception start determine section 133, the operation clock control circuit 151 supplies an operation clock to the digital demodulator section 107 and the gain control section 108 so that the sections 107, 108 can operate. In response to the reception start signal from the reception start determine section 133, the power control circuit 152 supplies power to the gain regulator section 105 so that the circuit can operate.

In response to an AGC control completion signal from the AGC control circuit 150, the operation state control section 109 controls the signal detector section 106 (RSSI circuit 131, ADC 132, and reception start determine section 133). In other words, the power control circuit 152 suspends power supply to the RSSI circuit 131 in response to an AGC control completion signal so that the circuit 131 stops operating. In response to the AGC control completion signal, the operation clock control circuit 151 suspends operation clock supply to the ADC 132 and the reception start determine section 133 so that they stop operating.

In response to the packet terminate signal from the baseband demodulator circuit 142, the operation state control section 109 controls the operation of the gain regulator section 105, the signal detector section 106, the digital demodulator section 107, and the gain control section 108. In other words, the operation clock control circuit 151, in response to the packet terminate signal, suspends operation clock supply to the digital demodulator section 107 and the gain control section 108 so that the sections 107, 108 stop operating, and starts operation clock supply to the ADC 132 and the reception start determine section 133 so that they start operating. The power control circuit 152, in response to the packet terminate signal, stops power supply to the gain regulator section 105 so that the section 105 stops operating, and starts power supply to the RSSI circuit 131 so that the circuit 131 can operate.

Next will be described steps of controlling the operation state of each member in the wireless LAN terminal 101 in reference to the FIG. 4 flow chart.

First, in the wireless LAN terminal 101 in accordance with the present embodiment, in reception standby periods when no data (signal) is being received, only the radio frequency signal processor section 104, the signal detector section 106, and the operation state control section 109 (operation clock control circuit 151 and power control circuit 152) are in operation; the gain regulator section 105 (analog section), the gain control section 8, and the digital demodulator section 7 (digital section 20) are not in operation (S15).

In other words, in the reception standby period, the power control circuit 152 stops power supply to the gain regulator section 105. Also, the operation clock control circuit 151 stops operation clock supply to the digital demodulator section 107 and the gain control section 108. This suspension of operation of the gain regulator section 105 in the analog section, the digital demodulator section 7, and the gain control section 8 (digital section) in the reception standby period contributes to power savings. This is especially true with the wireless LAN terminal which stands by for an extended period of time for reception.

Note that the wireless LAN terminal 101 is able to recognize a data (packet) transmission to itself throughout the reception standby period, because the radio frequency signal processor section 104 and the signal detector section 106 are still in operation.

If the reception start determine section 133 determines that the radio frequency signal received by the radio frequency signal processor section 104 (antenna 111) has a reception strength not less than a predetermined threshold value (S16), the wireless LAN terminal 101 switches from a reception standby state to a receive state (S17). The signal processing flow (S15 to S17) is explained in detail in the following.

A signal (radio frequency signal), received by the antenna 111, is amplified by the low noise amplifier 112 at a low NF and fed to both the radio frequency mixer 114a and the radio frequency mixer 114b. In the radio frequency mixer (RF mixer) 114a, one of the signal outputs of the low noise amplifier 112 is mixed with an oscillating signal from the radio frequency oscillator (RFOSC) 113. The mixing down converts a signal from the low noise amplifier 112 to a baseband signal (in-phase component). The output signal from the radio frequency mixer 114a is fed to the low pass filter 115a where unnecessary components are removed from the signal from the radio frequency mixer 114a. The other signal output of the low noise amplifier 112 is mixed in the radio frequency mixer (RF mixer) 114b with the oscillating signal from the radio frequency oscillator (RFOSC) 113 after a π/2 phase-shifting of the oscillating signal. The mixing down converts the signal from the low noise amplifier 112 to a baseband signal (quadrature component). The output signal from the radio frequency mixer 114b is fed to the low pass filter 115b where unnecessary components are removed from the signal from the radio frequency mixer 114b.

The output signal from the low pass filter 115 is fed to the reception strength sensor section (RSSI) 131 where the RSSI value (reception strength) of the incoming signal is sensed. The RSSI value, as sensed by the RSSI circuit 131, is digitized in the ADC 132 and supplied to the reception start determine section 133. If the RSSI value increases in excess of a threshold increase value (over an early part of the RSSI value), the reception start determine section 133 determines that it has detected a signal (Yes in S16) and supplies a reception start signal to the operation state control section 109. Reception is hence started (S17).

In response to the reception start signal from the reception start determine section 133, in the operation state control section 109, the power control circuit 152 starts power supply to the gain regulator section 105, and the operation clock control circuit 151 starts operation clock supply to the digital demodulator section 107 and the gain control section 108.

The actions turn on (activate) the gain regulator section 105, the digital demodulator section 107, and the gain control section 108 which have been off (out of operation) (see S18). The radio frequency signal processor section 104 and the signal detector section 106 which have been energized (on) remain energized (on) (see S18).

As the gain control section 108 is activated, the reception start determine section 133 passes the RSSI value (reception strength) to the AGC control circuit 150. The AGC control circuit 150 controls the AGC circuit 122 through DAC 160 on the basis of the reception strength. When the AGC circuit 122 completes the control (Yes in S19), the AGC control circuit 150 transmits an AGC control completion signal to the operation state control section 109.

This causes a switching to reception period power saving mode (Yes in S20). Specifically, having received the AGC control completion signal, the operation clock control circuit 151 stops operation clock supply to the ADC 132 and the reception start determine section 133. The power control circuit 152 stops power supply to the RSSI circuit 131. Thus, the signal detector section 106 stops operating, whereas the radio frequency signal processor section 104, the gain regulator section 105, the digital demodulator section 107, and the gain control section 108 remain in operation (S21). This action of suspending the operation of the signal detector section 106 (especially, suspending the power supply to the RSSI circuit 131) during signal reception (from the start of reception to the termination of the reception) contributes to further power savings.

it is preferred if the reception period power saving mode is the default mode. The mode may not be selected; in which case, the signal detector section 106, the radio frequency signal processor section 104, the gain regulator section 105, the digital demodulator section 107, and the gain control section 108 are all on (in operation) and remain in operation (S22).

Following S21 or S22, packet data is demodulated (S23). The signal processing in S23 is now detailed in the following.

When the AGC circuit 122 completes the control of the AGC control circuit 150 in S19, the output signal from one of low pass filters (115a) is suitably gain-regulated in the AGC circuit 122 and fed to the amplifier circuit 126a for amplification. The output signal from the amplifier circuit 126a is fed to the ADC 141a in the digital demodulator section 107. The output signal from the other low pass filter (115b) is suitably gain-regulated in the AGC circuit 122 and fed to the amplifier circuit 126b for amplification. The output signal from the amplifier circuit 126b is fed to the ADC 141b in the digital demodulator section 107.

The baseband demodulator circuit (BB demodulator circuit) 142 in the digital demodulator section 107 demodulates the incoming signal (packet data) to the wireless LAN terminal 101 according to the signals from the A/D converter 141a and the A/D converter 141b. The demodulated data is passed to an upper layer.

Having completed the signal demodulation (S24), the baseband demodulator circuit 142 sends a packet demodulation terminate signal to the operation state control section 109. Thus, the wireless LAN terminal 101 switches back to reception standby state (S25).

Specifically, having received a packet demodulation terminate signal from the baseband demodulator circuit 142, the power control circuit 152 in the operation state control section 109 stops power supply to the gain regulator section 105, and starts power supply to the RSSI circuit 131 in the signal detector section 106. The operation clock control circuit 151 stops operation clock supply to the digital demodulator section 107 and the gain control section 108, and starts power supply to the ADC 132 and the reception start determine section 133 in the signal detector section 106.

Embodiment 2

Figure 1:
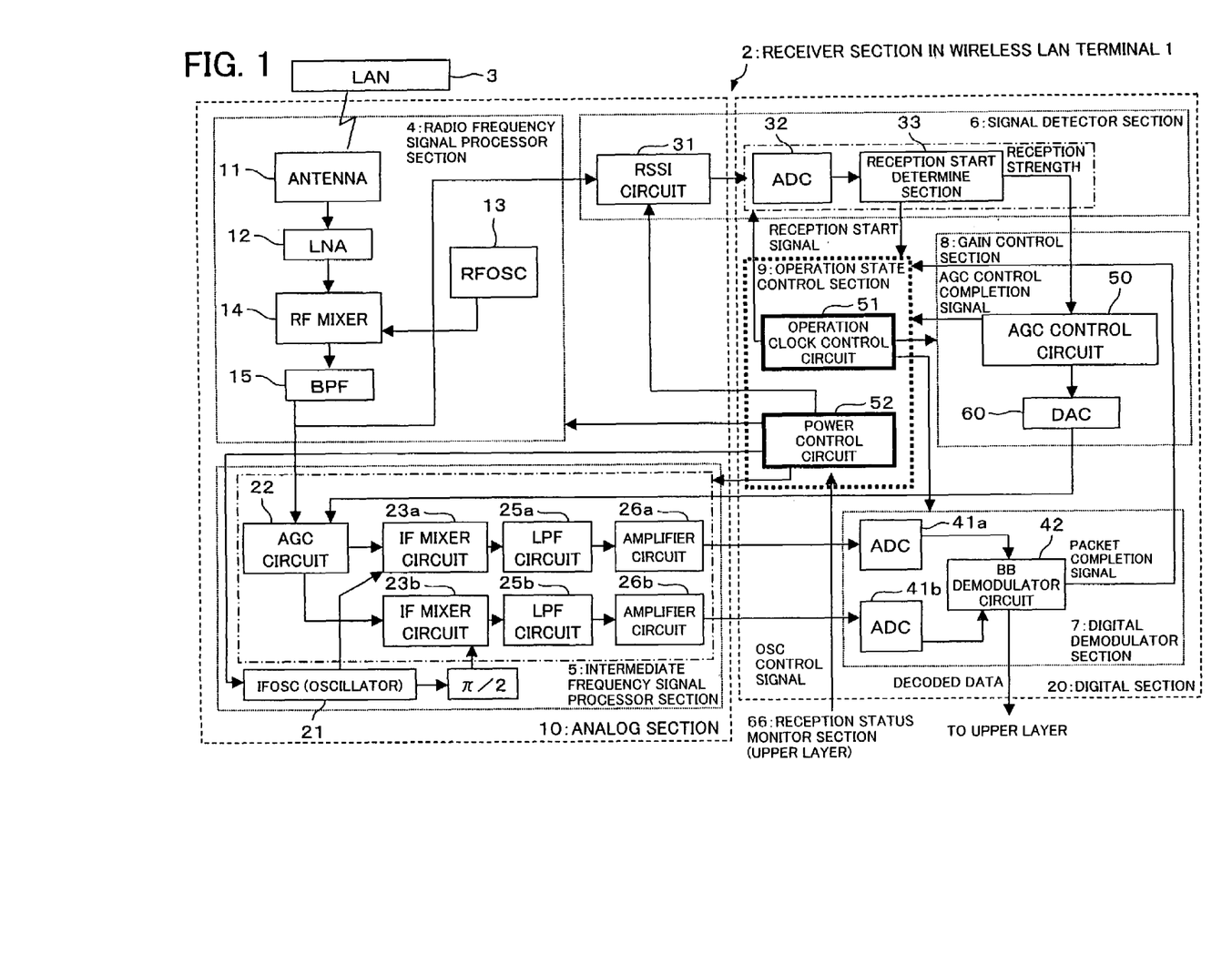
FIG. 1 is a block diagram showing an arrangement of a wireless LAN terminal (receiver section) in accordance with embodiment 1 of the present invention.
Figure 2:
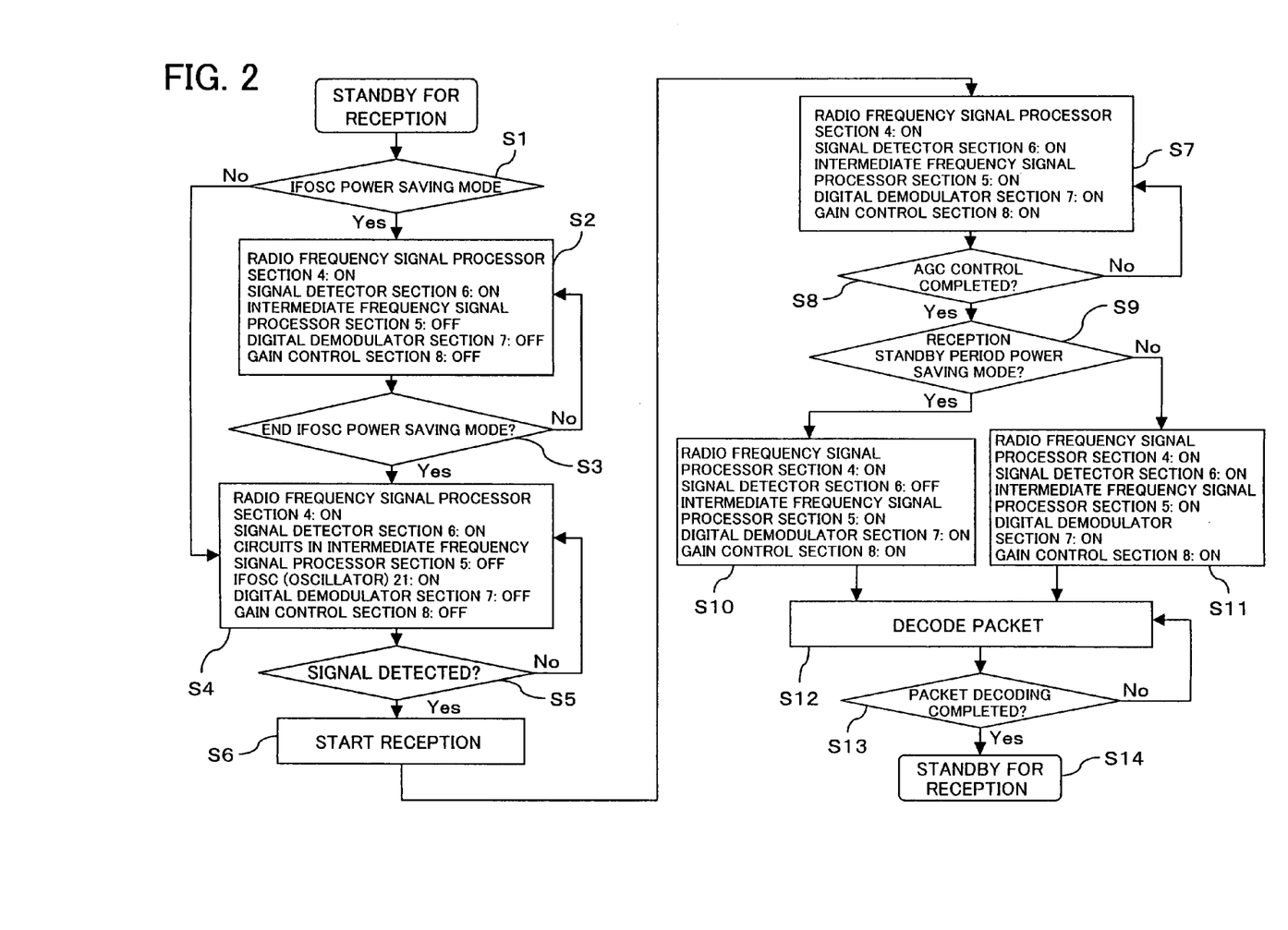
FIG. 2 is a flow chart illustrating the control the operation state of the wireless LAN terminal in FIG. 1.

The following will describe an embodiment of the wireless LAN terminal (receiver device, communications device, wireless LAN device) of the present invention with reference to FIGS. 1, 2.

Referring first to FIG. 1, a receiver section 2 in a wireless LAN terminal 1 in accordance with the present embodiment has a double heterodyne structure composed chiefly of a radio frequency signal processor section 4, a signal detector section 6, an intermediate frequency signal processor section 5, a digital demodulator section (demodulator section) 7, a gain control section 8, and an operation state control section 9.

The radio frequency signal processor section 4, the intermediate frequency signal processor section 5, and a part of the signal detector section 6 (RSSI circuit 31) make up an analog section 10. Another part of the signal detector section 6 (ADC 32, reception start determine section 33), the digital demodulator section 7, the gain control section 8, and the operation state control section 9 make up a digital section 20.

The radio frequency signal processor section 4 includes an antenna 11, a low noise amplifier (LNA) 12, a radio frequency oscillator (RFOSC) 13, a radio frequency mixer (RF mixer) 14, and a bandpass filter (BPF) 15. The antenna 11 receives a radio frequency signal from a LAN (local area network) 3 between which and the wireless LAN terminal 1 is established a wireless link. The low noise amplifier 12 amplifies the radio signal 11 received by the antenna 11 at a low NF (noise figure). The radio frequency oscillator 13 oscillates to generate a signal which is used in down converting the radio frequency signal to a lower frequency (intermediate frequency signal). The radio frequency mixer 14 mixes the radio frequency signal output of the low noise amplifier 12 with the oscillating signal output of the radio frequency oscillator 13 to deliver an intermediate frequency signal at a lower frequency than the radio frequency signal as an output. The bandpass filter 15 removes unnecessary components from the intermediate frequency signal output of the radio frequency mixer 14 to generate a signal at a target frequency.

The intermediate frequency signal processor section 5 includes an IFOSC (intermediate frequency oscillator, or abbreviated as "IF oscillator") 21, an AGC (auto gain control) circuit (gain regulator circuit) 22, two IF (intermediate frequency) mixer circuits (simply "mixers") 23a, 23b, two LPF (low pass filter) circuits 25a, 25b, and two AMP (amplifier) circuits 26a, 26b. The intermediate frequency oscillator 21 oscillates to generate a signal which is used in down converting the intermediate frequency signal to an even lower frequency (baseband signal). The intermediate frequency mixer circuit 23a mixes the intermediate frequency signal output of the AGC circuit 22 with the oscillating signal output of the intermediate frequency oscillator 21 to deliver a baseband signal (in-phase component) as an output. The intermediate frequency mixer circuit 23b mixes the intermediate frequency signal output of the AGC circuit 22 with the oscillating signal output of the intermediate frequency oscillator 21 after a $\pi/2$ phase-shifting of the oscillating signal, to deliver a baseband signal (quadrature component) as an output. The low pass filter circuit 25a removes unnecessary components from the baseband signal (in-phase component) output of the intermediate frequency mixer circuit 23a to generate a signal at a target frequency. Similarly, the low pass filter circuit 25b removes unnecessary components from the baseband signal (quadrature component) output of the intermediate frequency mixer circuit 23b. The amplifier circuit 26a amplifies the output of the low pass filter circuit 25a which is the baseband signal (in-phase component) minus unnecessary components. The amplifier circuit 26b amplifies the output of the low pass filter circuit 25b which is the baseband signal (quadrature component) minus unnecessary components.

The signal detector section 6 includes the RSSI (receive signal strength indicator) circuit (reception strength sensor section) 31 which makes up part of the analog section 10; and the ADC (A/D converter) 32 and the reception start determine section 33 which make up part of the digital section 20. The RSSI circuit 31 generates an RSSI signal from the intermediate frequency signal output of the bandpass filter 15 for output to the A/D converter 32. The A/D converter 32 then digitizes the RSSI signal detected in the RSSI circuit 31 for output to the reception start determine section 33.

Figure 5:
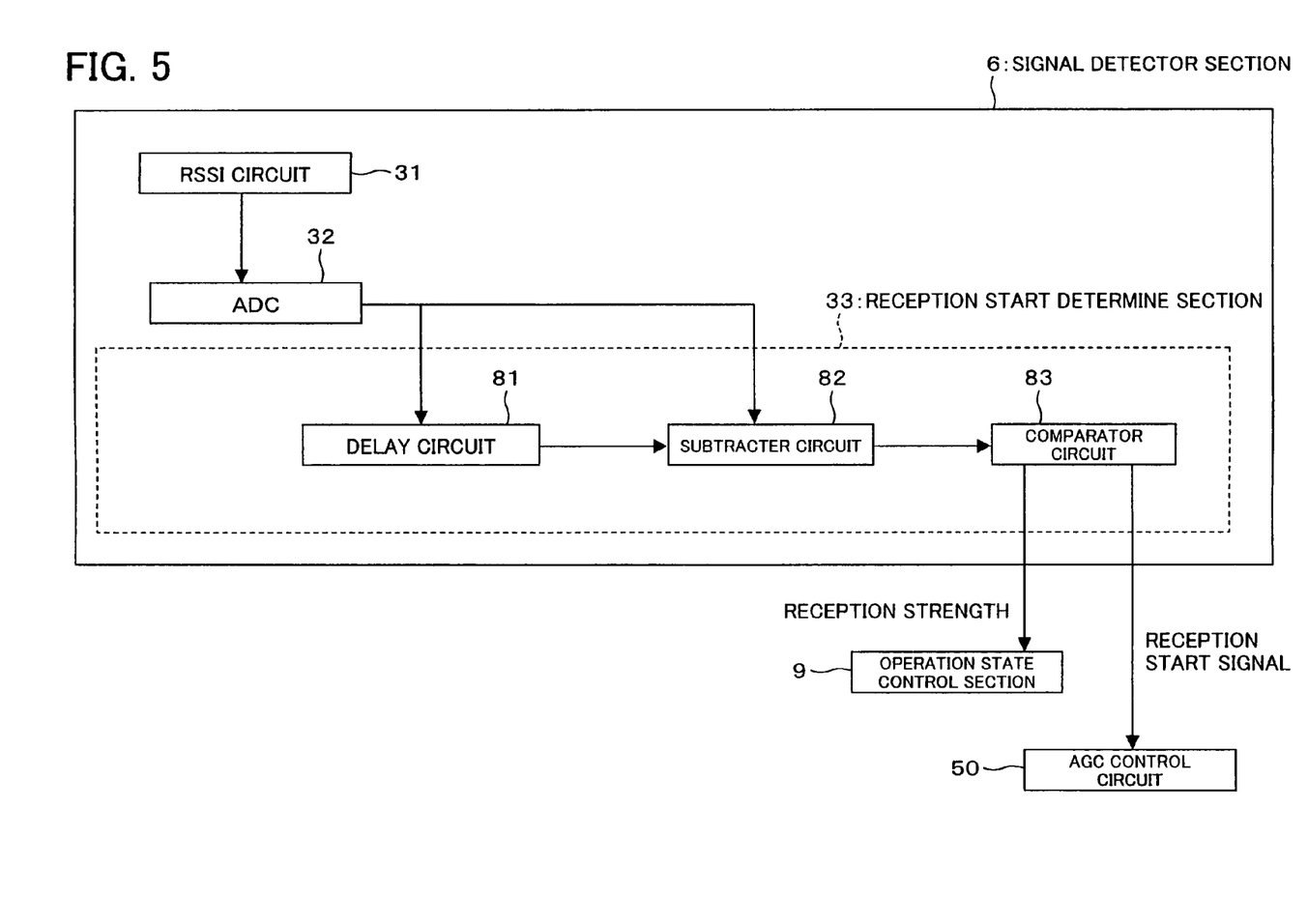
FIG. 5 is a block diagram showing an arrangement of a signal detector section in accordance with embodiment 2 of the present invention.

The reception start determine section 33 determines whether to start reception as follows. Referring to FIG. 5 which is a block diagram showing an arrangement of the reception start determine section 33, the reception start determine section 33 includes a delay circuit 81, a subtracter circuit 82, and a comparator circuit 83. In the arrangement, first, the delay circuit 81 delays sample values of an early part of the now digitized RSSI signal. The delayed values will be used as a reference in identify increases in the RSSI. The subtracter circuit 82 subtracts this reference from succeeding sample values of the RSSI signal to identify the RSSI value increase (the result of sensing by the reception strength sensor section). The comparator circuit 83 then compares the RSSI value increase to a preset threshold increase value. If the RSSI value increase is greater than the threshold increase value (if the increase meets a predetermined condition), the circuit 83 determines that a signal has been detected and transmits a reception start signal to the operation state control section 9. Also, the reception start determine section 33 supplies the RSSI value as indicating the reception strength to an AGC control circuit 50 in the gain control section 8. By making a decision to start reception based on a sample value increase exceeding a threshold value in this manner, the targeted incoming signal is not missed in the input which may include both the target signal and interference signals. A reception start is accurately determined.

The reference does not necessarily provided by the delay circuit 81, but may be provided by a sample and hold circuit which samples the RSSI signal and holds the value at certain times. The reception start determine section 33 may include a simple arrangement to determine whether the reception strength output of the A/D converter 32 exceeds a threshold value (predetermined level) and if so, supply a reception start signal to the operation state control section 9.

The digital demodulator section 7 includes two ADCs (A/D converters) 41a, 41b and a BB (baseband) demodulator circuit 42. The A/D converter 41a converts the baseband signal from the amplifier circuit 26a from analog to digital. Similarly, the A/D converter 41b converts a baseband signal from the amplifier circuit 26b from analog to digital. The baseband demodulator circuit 42 demodulates the digital signal outputs of the A/D converters 41a, 41b to reproduce original data (transmitted information) for output to an upper layer. Having completed the signal (packet data) demodulation, the baseband demodulator circuit 42 sends a packet terminate signal to the operation state control section 9.

The gain control section 8 includes an AGC control circuit 50 and a DAC (D/A converter) 60. The AGC control circuit 50 controls the AGC circuit 22 according to the reception strength output of the reception start determine section 33. Having completed the control of the AGC circuit 22, the AGC control circuit 50 sends an AGC control completion signal to the operation state control section 9.

The operation state control section 9 includes an operation clock control circuit (digital operation control section) 51 and a power control circuit (power control section) 52. In response to a reception start signal from the reception start determine section 33, the operation clock control circuit 51 supplies an operation clock to the digital demodulator section 7 and the gain control section 8 so that the sections 7, 8 can operate. In response to a reception start signal from the reception start determine section 33, the power control circuit 52 supplies power to the AGC circuit 22, the IF mixer circuits 23a, 23b, the LPF circuits 25a, 25b, and the amplifier circuits 26a, 26b, all in the intermediate frequency signal processor section 5, so that the circuits can operate.

A reception status monitor section 66 which monitors the data reception state (reception interval) of the radio frequency signal processor section 4 is provided in an upper layer relative to the physical layer. The circuit 52 controls power supply to (start/stop the operation of) the intermediate frequency oscillator (IFOSC) 21 according to an OSC control signal from the reception status monitor section 66.

In response to an AGC control completion signal from the AGC control circuit 50, the operation state control section 9 controls the signal detector section 6 (RSSI circuit 31, ADC 32, and reception start determine section 33). In other words, the power control circuit 52 suspends power supply to the RSSI circuit 31 in response to an AGC control completion signal so that the circuit 31 stops operating. In response to the AGC control completion signal, the operation clock control circuit 51 suspends operation clock supply to the ADC 32 and the reception start determine section 33 so that they stop operating.

In response to the packet terminate signal from the baseband demodulator circuit 42, the operation state control section 9 controls the operation of all the circuits in the intermediate frequency signal processor section 5, as well as the operation of the signal detector section 6, the digital demodulator section 7, and the gain control section 8. In other words, the operation clock control circuit 51, in response to the packet terminate signal, suspends operation clock supply to the digital demodulator section 7 and the gain control section 8 so that the sections 7, 8 stop operating, and starts operation clock supply to the ADC 32 and the reception start determine section 33 so that they start operating. The power control circuit 52, in response to the packet terminate signal, stops power supply to the AGC circuit 22, the IF mixer circuits 23*a*, 23*b*, the LPF circuits 25*a*, 25*b*, and the amplifier circuits 26*a*, 26*b*, all in the intermediate frequency signal processor section 5, so that the circuits stop operating, and starts power supply to the RSSI circuit 31 so that the circuit 31 can operate.

Next will be described steps of controlling the operation state of each member in the receiver section 2 in the wireless LAN terminal 1 in reference to the FIG. 2 flow chart.

First, in the wireless LAN terminal 1, in reception standby periods when no data is being received, only the radio frequency signal processor section 4, the signal detector section 6, and the operation state control section 9 (operation clock control circuit 51 and power control circuit 52) are in operation; the circuits in the intermediate frequency signal processor section 5 (analog section 10), as well as the gain control section 8 and the digital demodulator section 7 (digital section 20), are not in operation. The intermediate frequency oscillator 21 in the analog section 10 may or may not operate depending on mode selection (will be detailed later).

In other words, in the reception standby period, the power control circuit 52 stops power supply to the AGC circuit 22, the IF mixer circuits 23*a*, 23*b*, the LPF circuits 25*a*, 25*b*, and the amplifier circuits 26*a*, 26*b*, all in the intermediate frequency signal processor section 5. Also, the operation clock control circuit 51 stops operation clock supply to the digital demodulator section 7 and the gain control section 8. This suspension of power supply to the circuits in the intermediate frequency signal processor section 5 in the reception standby period contributes to power savings. This is especially true with the wireless LAN terminal which stands by for an extended period of time for reception.

Note that the wireless LAN terminal 1 is able to recognize a data (packet) transmission to itself throughout the reception standby period, because the radio frequency signal processor section 4 and the signal detector section 6 are still in operation.

The wireless LAN terminal 1 allows for selection of IFOSC (intermediate frequency oscillator) power saving mode (reception standby period power saving mode) in the reception standby period (see S1). In the IFOSC power saving mode, the intermediate frequency oscillator 21 in the intermediate frequency signal processor section 5 is caused to stop operating. Specifically, the power control circuit 52 stops power supply to the intermediate frequency oscillator 21 according to an OSC control signal from the reception status monitor section 66 (upper layer) so that the intermediate frequency oscillator 21 stops operating.

Under these circumstances, when IFOSC power saving mode is selected in a reception standby period, the entire intermediate frequency signal processor section 5, including the intermediate frequency oscillator 21, the digital demodulator section 7, and the gain control section 8 are turned off (stop operating), with only the radio frequency signal processor section 4 and the signal detector section 6 being turned on (see S2). This suspension of power supply to the high power-consuming IFOSC (intermediate frequency oscillator) 21 in reception standby periods contributes to further power savings.

If IFOSC power saving mode is not selected in a reception standby period or if the mode is deselected (S3), all circuits in the intermediate frequency signal processor section 5, except for the intermediate frequency oscillator 21, (namely, the AGC circuit 22, the IF mixer circuits 23*a*, 23*b*, the LPF circuits 25*a*, 25*b*, and the amplifier circuits 26*a*, 26*b*), the digital demodulator section 7, and the gain control section 8 are turned off (stop operating), with the intermediate frequency oscillator 21, the radio frequency signal processor section 4, and the signal detector section 6 being turned on (starting operating) (see S4).

If the signal detector section 6 detects a signal coming from the radio frequency signal processor section 4 (S5), the wireless LAN terminal 1 switches from reception standby state to reception state to start reception (S6). The signal processing flow (S4 to S6) is explained in detail in the following.

A signal (radio frequency signal), received by the antenna 11, is amplified by the low noise amplifier 12 at a low NF. In the radio frequency mixer (RF mixer) 14, the output signal from the low noise amplifier (LNA) 12 is mixed with an oscillating signal from the radio frequency oscillator (RFOSC) 13 for down conversion to an intermediate frequency signal. The output signal from the radio frequency mixer 14 is fed to the bandpass filter 15 where unnecessary components are removed from the signal.

The output signal from the bandpass filter 15 is fed to the reception strength sensor section (RSSI) 31 where the RSSI value (reception strength) of the signal is sensed. The RSSI value, as sensed by the RSSI circuit 31, is digitized in the A/D converter 32 and supplied to the reception start determine section 33. If the RSSI value increases in excess of a threshold increase value (over an early part of the RSSI value), the reception start determine section 33 determines that it has detected a signal (Yes in S5) and supplies a reception start signal to the operation state control section 9. Reception is hence started (S6).

In response to the reception start signal from the reception start determine section 33, in the operation state control section 9, the power control circuit 52 starts supplying power to the circuits in the intermediate frequency signal processor section 5, and the operation clock control circuit 51 starts supplying an operation clock to the digital demodulator section 7 and the gain control section 8.

These actions turn on (activate) the AGC circuit 22, the IF mixer circuits 23*a*, 23*b*, the LPF circuits 25*a*, 25*b*, and the amplifier circuits 26*a*, 26*b*, all in the intermediate frequency signal processor section 5, which have been off (out of operation). The actions also turn on the digital demodulator section 7 and the gain control section 8 which have been off (out of operation) (see S7). The radio frequency signal processor section 4, the intermediate frequency oscillator 21, and the signal detector section 6 which have been on (in operation) remain on (in operation) (see S7).

As the gain control section 8 is energized (turned on), the reception start determine section 33 passes the reception strength from the ADC 32 on to the AGC control circuit 50. The AGC control circuit 50 controls the AGC circuit 22 through the DAC 60 on the basis of the reception strength. When the AGC circuit 22 completes the control (S8), the AGC control circuit 50 transmits an AGC control completion signal to the operation state control section 9.

This causes a switching to reception period power saving mode. Specifically, having received the AGC control completion signal, the operation clock control circuit 51 stops operation clock supply to the ADC 32 and the reception start determine section 33. The power control circuit 52 stops power supply to the RSSI circuit 31. Thus, the signal detector section 6 stops operating, whereas the radio frequency signal processor section 4, the intermediate frequency signal processor section 5, the digital demodulator section 7, and the gain control section 8 remain in operation. This action of suspending the operation of the signal detector section 6 (especially, suspending the power supply to the RSSI circuit 31) during signal reception (from the start of reception to the termination of the reception) contributes to further power savings.

it is preferred if the reception period power saving mode is the default mode. The mode may not be selected (S9); in which case, the same operation state as in S7 continues with the signal detector section 6, the radio frequency signal processor section 4, the intermediate frequency signal processor section 5, the digital demodulator section 7, and the gain control section 8 are all turned on (S1).

Following S10 or S11, packet data is demodulated (S12). The signal processing in S12 is now detailed in the following.

When the AGC control circuit 50 completes the control of the AGC circuit 22 in S8, a signal output of the bandpass filter 15 is suitably gain-regulated in the AGC circuit 22 and fed to both the intermediate frequency mixer circuit 23a and the intermediate frequency mixer circuit 23b.

One of the signal outputs from the AGC circuit 22 is mixed in the intermediate frequency mixer circuit 23a with an oscillating signal from the intermediate frequency oscillator 21. Thus, the intermediate frequency mixer circuit 23a outputs a baseband signal (in-phase component) to the LPF circuit 25a where unnecessary components are removed. The signal output of the LPF circuit 25a is fed to the amplifier circuit 26a for amplification. The signal output of the amplifier circuit 26a is fed to the ADC 41a in the digital demodulator section 7.

The other signal output from the AGC circuit 22 is mixed in the intermediate frequency mixer circuit 23b with the oscillating signal from the intermediate frequency oscillator 21 after a $\pi/2$ phase-shifting of the oscillating signal. Thus, the intermediate frequency mixer circuit 23b outputs a baseband signal (quadrature component) to the LPF circuit 25b where unnecessary components are removed. The signal output of the LPF circuit 25b is fed to the amplifier circuit 26b for amplification. The signal output of the amplifier circuit 26b is fed to the ADC 41b in the digital demodulator section 7.

The baseband demodulator circuit (BB demodulator circuit) 42 in the digital demodulator section 7 demodulates the incoming signal (packet data) to the wireless LAN terminal 1 according to the signals from the A/D converter 41a and the A/D converter 41b. The demodulated data is passed to an upper layer. Having completed the signal demodulation (S13), the baseband demodulator circuit 42 sends a packet demodulation terminate signal to the operation state control section 9. Thus, the wireless LAN terminal 1 switches back to reception standby state (S14).

Specifically, having received a packet demodulation terminate signal from the baseband demodulator circuit 42, the power control circuit 52 in the operation state control section 9 stops power supply to all the circuits in the intermediate frequency signal processor section 5 (the AGC circuit 22, the IF mixer circuits 23a, 23b, the LPF circuits 25a, 25b, and the amplifier circuits 26a, 26b) and starts power supply to the RSSI circuit 31 in the signal detector section 6. The operation clock control circuit 51 stops operation clock supply to the digital demodulator section 7 and the gain control section 8, and starts power supply to the ADC 32 and the reception start determine section 33 in the signal detector section 6.

The following is a further explanation of embodiments 1 and 2 above.

As detailed in the foregoing, according to the receiver device in accordance with the present invention, the power control section controls power supply to the circuits in the second signal processor section (intermediate frequency signal processor section) according to the result of the sensing by the reception strength sensor section. As a result, unlike conventional art where the entire analog section is always powered and kept in operation, power waste in the second signal processor section (intermediate frequency signal processor section) is greatly reduced while the analog section is waiting for a signal to be received (during reception standby). The arrangement thus achieves power savings in the receiver device.

As described so far, it is preferred if: the second signal processor section includes a gain regulator circuit gain-regulating a signal from the first signal processor section and an amplifier circuit amplifying a signal from the gain regulator circuit; and the power control section suspends power supply to the gain regulator circuit and the amplifier circuit while the result of the sensing does not meet a predetermined condition, and starts power supply to the gain regulator circuit and the amplifier circuit when the result of the sensing comes to meet the predetermined condition.

According to the arrangement, the signal from the first signal processor section undergoes gain regulation (for example, auto gain control) and amplification processes in the gain regulator circuit and the amplifier circuit in the second signal processor section. The power control section controls power supply to the gain regulator circuit and the amplifier circuit according to a result of the sensing by the reception strength sensor section. Specifically, the power control section suspends power supply to the gain regulator circuit and the amplifier circuit until the result of the sensing by the reception strength sensor section meets a predetermined condition. As a result, power waste in the gain regulator circuit and the amplifier circuit is greatly reduced while waiting for a signal to be received (demodulatable signal) (during reception standby).

It is also preferred if the receiver device of the present is adapted so that: the power control section is capable of controlling power supply to the reception strength sensor section; and the power control section suspends power supply to the reception strength sensor section when the gain regulator circuit is powered on and completes gain regulation.

The arrangement allows for suspension of power supply to the reception strength sensor section when the result of the sensing by the reception strength sensor section meets a predetermined condition, and the gain regulator circuit operates and completes gain regulation. The arrangement is applicable, because after completion of gain regulation, the reception strength sensor section does not need to be in operation until the demodulator section completes signal demodulation. This action of suspending power supply to the reception strength sensor section when the reception strength sensor section does not need to be in operation allows for more power savings.

The receiver device may be arranged to further include: a gain control section controlling the gain regulator circuit; and a digital operation control section controlling operation states of the gain control section and the demodulator section.

It is preferred if the receiver device is adapted so that in a reception standby period when the result of the sensing does not meet the predetermined condition, the power control section supplies power to the first signal processor section and the reception strength sensor section, but does not supply power to the second signal processor section, and the digital operation control section causes the demodulator section and the gain control section to stop operating.

In the reception standby period, the arrangement allows for suspension of power supply to the second signal processor section, which does not need to be in operation, and suspension of the operation of the demodulator section and the gain control section. The arrangement thus contributes to further power savings.

In the receiver device, when the result of the sensing comes to meet the predetermined condition, the power control section starts power supply to the second signal processor section and continues to supply power to the first signal processor section and the reception strength sensor section, and the digital operation control section causes the demodulator section and the gain control section to start operating. The arrangement subjects the signal from the first signal processor section to gain regulation and amplification processes in the second signal processor section and the signal from the second signal processor section to demodulation in the demodulator section to reproduce transmitted information.

It is also preferred if the receiver device is adapted so that: the receiver device allows for selection of reception period power saving mode in which when the gain control section ends control of the gain regulator circuit; and the power control section suspends power supply to the reception strength sensor section, but continues to supply power to the second signal processor section, and the digital operation control section causes the demodulator section and the gain control section to remain in operation.

According to the arrangement, when the result of the sensing meets the predetermined condition, the gain control section controls the gain regulator circuit in the second signal processor section. Thus, the signal from the first signal processor section is optimally gain-regulated by the gain regulator circuit, before going through the amplifier circuit in the second signal processor section and being passed onto the demodulator section. This action of suspending power supply to the reception strength sensor section which does not need to be in operation while the power control section is in a receiving process following the end of the control of the gain regulator circuit contributes to further power savings.

It is also preferred if: the intermediate frequency signal processor section includes an IF oscillator and a IF mixer circuit mixing a signal from the IF oscillator with a signal from the radio frequency signal processor section; and the power control section suspends power supply to the IF mixer circuit while the result of the sensing does not meet a predetermined condition, and starts power supply to the IF mixer circuit when the result of the sensing comes to meet the predetermined condition.

According to the arrangement, the signal from the radio frequency signal processor section is mixed with the signal from the IF oscillator in the IF mixer circuit in the intermediate frequency signal processor section, and converted to a lower frequency (for example, baseband signal). The power control section controls power supply to the IF mixer circuit according to the result of the sensing by the reception strength sensor section. Specifically, the power control section suspends power supply to the IF mixer circuit until the result of the sensing by the reception strength sensor section meets the predetermined condition. As a result, power waste in the IF mixer circuit is eradicated while waiting for a signal to be received (demodulatable signal) (during reception standby).

It is preferred if: the intermediate frequency signal processor section further includes: a gain regulator circuit gain-regulating the signal from the radio frequency signal processor section for output to the IF mixer circuit; a low pass filter circuit where a signal from the IF mixer circuit is input; and an amplifier circuit amplifying a signal from the low pass filter circuit; and the power control section suspends power supply to the gain regulator circuit, the low pass filter circuit, and the amplifier circuit while the result of the sensing does not meet the predetermined condition, and starts power supply to the gain regulator circuit, the low pass filter circuit, and the amplifier circuit when the result of the sensing comes to meet the predetermined condition.

According to the arrangement, the signal from the radio frequency signal processor section is gain-regulated by the gain regulator circuit, mixed with the signal from the IF oscillator in the IF mixer circuit, and converted to a lower frequency (for example, baseband signal). The output signal from the IF mixer circuit is fed to the low pass filter circuit where unnecessary components are removed, and amplified by the amplifier circuit. The power control section controls power supply to the gain regulator circuit, the low pass filter circuit, and the amplifier circuit according to the result of the sensing by the reception strength sensor section. Specifically, the power control section suspends power supply to the gain regulator circuit, the low pass filter circuit, and the amplifier circuit until the result of the sensing by the reception strength sensor section meets the predetermined condition. As a result, power waste in the gain regulator circuit, the low pass filter circuit, and the amplifier circuit is eradicated while waiting for a signal to be received (demodulatable signal) (during reception standby).

It is also preferred if the receiver device in accordance with the present invention is adapted so that the IF oscillator is powered on regardless of the result of the sensing. The arrangement eliminates the need for an element controlling power supply to the IF oscillator (for example, from the upper layer), allowing for simplified structure.

The receiver device in accordance with the present invention may be adapted so that: the power control section is capable of controlling power supply to the IF oscillator; and the power control section controls the power supply to the IF oscillator according to a result of monitoring by a reception status monitor section monitoring reception status of the radio frequency signal processor section.

According to the arrangement, controlling power supply to the IF oscillator, which is a high power consuming component in the intermediate frequency signal processor section, allows for more power savings.

It is also preferred if the receiver device in accordance with the present invention is adapted so that: the power control section is capable of controlling power supply to the reception strength sensor section; and the power control section suspends power supply to the reception strength sensor section when the gain regulator circuit is powered on and completes gain regulation.

The arrangement allows for suspension of power supply to the reception strength sensor section when the result of the sensing by the reception strength sensor section meets a predetermined condition, and the gain regulator circuit operates and completes gain regulation. The arrangement is applicable, because after completion of gain regulation, the reception strength sensor section does not need to be in operation until the demodulator section completes signal demodulation. This action of suspending power supply to the reception strength sensor section when the reception strength sensor section does not need to be in operation allows for more power savings.

The receiver device may be arranged so that the power control section is further capable of controlling power supply to the IF oscillator, and includes a gain control section controlling the gain regulator circuit and a digital operation control section controlling operation states of the gain control section and the demodulator section.

It is also preferred if the receiver device is adapted so that in a reception standby period when the result of the sensing does not meet the predetermined condition, the power control section supplies power to the radio frequency signal processor section and the reception strength sensor section, but does not supply power to circuits in the intermediate frequency signal processor section, and the digital operation control section causes the demodulator section and the gain control section to stop operating.

In the reception standby period, the arrangement allows for suspension of power supply to the circuits in the intermediate frequency signal processor section, which do not need to be in operation, and suspension of the operation of the demodulator section and the gain control section. The arrangement thus contributes to further power savings.

It is also preferred if the receiver device is adapted so that: the receiver device allows for selection of reception standby period power saving mode; and the power control section suspends power supply to the IF oscillator in the reception standby period power saving mode, and starts power supply to the oscillator when the reception standby period power saving mode ends. According to the arrangement, in the reception standby period, power supply to the IF oscillator, which does not need to be in operation, is suspended. This contributes to further power savings.

In the receiver device, when the result of the sensing comes to meet the predetermined condition, the power control section starts power supply to circuits in the intermediate frequency signal processor section and continues to supply power to the IF oscillator, the radio frequency signal processor section, and the reception strength sensor section, and the digital operation control section causes the demodulator section and the gain control section to start operating. The arrangement subjects the signal from the radio signal processor section to gain regulation, down conversion, unnecessary components removal, and amplification processes in the intermediate frequency signal processor section. The signal from the intermediate frequency signal processor section is demodulated in the demodulator section to reproduce transmitted information.

It is also preferred if the receiver device is adapted so that the receiver device allows for selection of reception period power saving mode in which when the gain control section ends control of the gain regulator circuit, the power control section suspends power supply to the reception strength sensor section and continues to supply power to the IF oscillator and the circuits in the intermediate frequency signal processor section, and the digital operation control section causes the demodulator section and the gain control section to continue to operate.

According to the arrangement, when the result of the sensing meets the predetermined condition, the gain control section controls the gain regulator circuit in the intermediate frequency signal processor section. Thus, the signal from the radio frequency signal processor section is optimally gain-regulated by the gain regulator circuit, before being mixed with the signal from the IF oscillator (down conversion), going through the low pass filter circuit and the amplifier circuit in the intermediate frequency signal processor section, and being passed onto the demodulator section. This action of suspending power supply to the reception strength sensor section which does not need to be in operation while the power control section is in a receiving process following the end of the control of the gain regulator circuit contributes to further power savings.

A communications device in accordance with the present invention is characterized by the inclusion of the receiver device.

A wireless LAN device in accordance with the present invention is characterized in that the inclusion of the receiver device.

A power control method for a receiver device in accordance with the present invention, to address the issues, is applied to a receiver device including: a first signal processor section converting an incoming radio frequency signal to a lower frequency; a reception strength sensor section sensing a signal strength of the radio frequency signal; and a second signal processor section carrying out a process on a signal from the first signal processor section to improve demodulation precision, and is characterized in that the method includes: suspending power supply to circuits in the second signal processor section while a result of the sensing by the reception strength sensor section does not meet a predetermined condition; and starting power supply to the circuits in the second signal processor section when the result of the sensing comes to meet the predetermined condition.

Another power control method for a receiver device in accordance with the present invention, to address the issues, is applied to a receiver device including: a radio frequency signal processor section converting an incoming radio frequency signal to a lower frequency; a reception strength sensor section sensing a signal strength of the radio frequency signal; and an intermediate frequency signal processor section converting a signal from the radio frequency signal processor section to an even lower frequency, and is characterized in that the method includes: suspending power supply to circuits in the intermediate frequency signal processor section while a result of the sensing by the reception strength sensor section does not meet a predetermined condition; starting power supply to the circuits in the intermediate frequency signal processor section when the result of the sensing comes to meet the predetermined condition.

A power control program for a receiver device in accordance with the present invention is characterized in that the program causes a computer to implement the power control method for a receiver device.

A computer-readable storage medium in accordance with the present invention is characterized in that the medium contains the power control program for a receiver device.

Embodiments 1, 2 assumed that the operation of each component in the digital section is controlled through the suspension/start of an operation clock supply from the operation clock control circuit. This is however not the only possibility. For example, the power control circuit may control power supply to the components (ADC, reception start determine section, digital demodulator section, gain control section) in the digital section. The functionality of the operation state control section may be implemented either in hardware or by a computer executing a program. An example of the latter case is a CPU or similar computing means executing program code contained in a ROM, RAM, or other storage medium.

In addition, embodiments 1, 2 assumed a double heterodyne or direct conversion system. The receiver device in accordance with the present invention may however be applied to other kinds of systems as well. The arrangements of the present invention are applicable to any receiver in which an analog processor section (second analog processor section: for example, second signal processor section or intermediate frequency signal processor section) is provided between the radio frequency signal (RF) processor section (first analog processor section: for example, first signal processor section) and the digital processor section (for example, demodulator section) for the purpose of improving demodulation precision. With the invention being applied, the power control section can control power supply to the second analog processor section.

The receiver device in accordance with the present invention may be defined as including: a first signal processor section converting an incoming radio frequency signal to a lower frequency; a reception strength sensor section sensing a signal strength of the radio frequency signal; a second signal processor section carrying out a process on a signal from the first signal processor section to improve demodulation precision; a demodulator section demodulating a signal from the second signal processor section; and an operation state control section controlling start/suspension of the operation of circuits in the second signal processor section according to a result of the sensing by the reception strength sensor section.

The receiver device in accordance with the present invention may be defined as including: a radio frequency signal processor section converting an incoming radio frequency signal to a lower frequency; a reception strength sensor section sensing a signal strength of the radio frequency signal; an intermediate frequency signal processor section converting a signal from the radio frequency signal processor section to an even lower frequency; a demodulator section demodulating a signal from the intermediate frequency signal processor section; and an operation state control section controlling start/suspension of the operation of circuits in the intermediate frequency signal processor section according to a result of the sensing by the reception strength sensor section.

The receiver device in accordance with the present invention are applicable to, for example, a wireless LAN terminal mounted in PDAs and other mobile terminals.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A receiver device, comprising:
a first signal processor section converting an incoming radio frequency signal to a lower frequency;
a reception strength sensor section sensing a signal strength of the radio frequency signal;
a second signal processor section carrying out a process on a signal from the first signal processor section to improve demodulation precision;
a demodulator section demodulating a signal from the second signal processor section; and
a power control section controlling power supply to circuits in the second signal processor section according to a result of sensing by the reception strength sensor section, wherein:
the second signal processor section includes: a gain regulator circuit gain-regulating the signal from the first signal processor section; and an amplifier circuit amplifying a signal from the gain regulator circuit; and
the power control section suspends power supply to the gain regulator circuit and the amplifier circuit while the result of the sensing does not meet a predetermined condition, and starts power supply to the gain regulator circuit and the amplifier circuit when the result of the sensing comes to meet the predetermined condition.

2. The receiver device as set forth in claim 1, wherein:
the power control section is capable of controlling power supply to the reception strength sensor section; and
the power control section suspends power supply to the reception strength sensor section when the gain regulator circuit is powered on and completes gain regulation.

3. The receiver device as set forth in claim 1, further comprising:
a gain control section controlling the gain regulator circuit; and
a digital operation control section controlling operation states of the gain control section and the demodulator section.

4. The receiver device as set forth in claim 3, wherein in a reception standby period when the result of the sensing does not meet the predetermined condition, the power control section supplies power to the first signal processor section and the reception strength sensor section, but does not supply power to the second signal processor section, and the digital operation control section causes the demodulator section and the gain control section to stop operating.

5. The receiver device as set forth in claim 3, wherein when the result of the sensing comes to meet the predetermined condition, the power control section starts power supply to the second signal processor section and continues to supply power to the first signal processor section and the reception strength sensor section, and the digital operation control section causes the demodulator section and the gain control section to start operating.

6. The receiver device as set forth in claim 5, wherein the receiver device allows for selection of reception period power saving mode in which when the gain control section ends control of the gain regulator circuit, the power control section suspends power supply to the reception strength sensor section, but continues to supply power to the second signal processor section, and the digital operation control section causes the demodulator section and the gain control section to remain in operation.

7. A communications device, comprising the receiver device as set forth in claim 1.

8. A wireless Local Area Network (LAN) device, comprising the receiver device as set forth in claim 1.

9. A receiver device, comprising:
a radio frequency signal processor section converting an incoming radio frequency signal to a lower frequency;
a reception strength sensor section sensing a signal strength of the radio frequency signal;
an intermediate frequency signal processor section converting a signal from the radio frequency signal processor section to an even lower frequency;
a demodulator section demodulating a signal from the intermediate frequency signal processor section; and
a power control section controlling power supply to circuits in the intermediate frequency signal processor section according to a result of sensing by the reception strength sensor section, wherein:
the intermediate frequency signal processor section includes an Intermediate Frequency (IF) oscillator and a if mixer circuit mixing a signal from the IF oscillator with a signal from the radio frequency signal processor section; and
the power control section suspends power supply to the IF mixer circuit while the result of the sensing does not meet a predetermined condition, and starts power supply to the If mixer circuit when the result of the sensing comes to meet the predetermined condition.

10. The receiver device as set forth in claim 9, wherein:
the intermediate frequency signal processor section further includes: a gain regulator circuit gain-regulating the signal from the radio frequency signal processor section for output to the IF mixer circuit; a low pass filter circuit where a signal from the IF mixer circuit is input; and an amplifier circuit amplifying a signal from the low pass filter circuit; and the power control section suspends power supply to the gain regulator circuit, the low pass filter circuit, and the amplifier circuit while the result of the sensing does not meet the predetermined condition, and starts power supply to the gain regulator circuit, the low pass filter circuit, and the amplifier circuit when the result of the sensing comes to meet the predetermined condition.

11. The receiver device as set forth in claim 10, wherein
the power control section is capable of controlling power supply to the reception strength sensor section; and the power control section suspends power supply to the reception strength sensor section when the gain regulator circuit is powered on and completes gain regulation.

12. The receiver device as set forth in claim 10, wherein the power control section is further capable of controlling power supply to the IF oscillator, and includes a gain control section controlling the gain regulator circuit and a digital operation control section controlling operation states of the gain control section and the demodulator section.

13. The receiver device as set forth in claim 12, wherein in a reception standby period when the result of the sensing does not meet the predetermined condition, the power control section supplies power to the radio frequency signal processor section and the reception strength sensor section, but does not supply power to circuits in the intermediate frequency signal processor section, and the digital operation control section causes the demodulator section and the gain control section to stop operating.

14. The receiver device as set forth in claim 13, wherein:
the receiver device allows for selection of reception standby period power saving mode; and the power control section suspends power supply to the IF oscillator in the reception standby period power saving mode, and starts power supply to the IF oscillator when the reception standby period power saving mode ends.

15. The receiver device as set forth in claim 12, wherein when the result of the sensing comes to meet the predetermined condition, the power control section starts power supply to circuits in the intermediate frequency signal processor section and continues to supply power to the IF oscillator, the radio frequency signal processor section, and the reception strength sensor section, and the digital operation control section causes the demodulator section and the gain control section to start operating.

16. The receiver device as set forth in claim 15, wherein the receiver device allows for selection of reception period power saving mode in which when the gain control section ends control of the gain regulator circuit, the power control section suspends power supply to the reception strength sensor section, but continues to supply power to the IF oscillator and the circuits in the intermediate frequency signal processor section, and the digital operation control section causes the demodulator section and the gain control section to continue to operate.

17. The receiver device as set forth in claim 9, wherein the IF oscillator is powered on regardless of the result of the sensing.

18. The receiver device as set forth in claim 9, wherein:
the power control section is capable of controlling power supply to the IF oscillator; and the power control section controls the power supply to the IF oscillator according to a result of monitoring by a reception status monitor section monitoring reception status of the radio frequency signal processor section.

19. A communications device, comprising said receiver device as set forth in claim 9.

20. A wireless Local Area Network (LAN) device, comprising said receiver device as set forth in claim 9.

21. A power control method for a receiver device including: a first signal processor section converting an incoming radio frequency signal to a lower frequency; a reception strength sensor section sensing a signal strength of the radio frequency signal; and a second signal processor section carrying out a process on a signal from the first signal processor section to improve demodulation precision, the second signal processor section including a gain regulator circuit gain-regulating the signal from the first signal processor section and an amplifier circuit amplifying a signal from the gain regulator circuit, said method comprising:

suspending power supply the gain regulator circuit and the amplifier circuit in the second signal processor section while a result of the sensing by the reception strength sensor section does not meet a predetermined condition; and starting power supply to the gain regulator circuit and the amplifier circuit in the second signal processor section when the result of the sensing comes to meet the predetermined condition.

22. A power control method for a receiver device including: a radio frequency signal processor section converting an incoming radio frequency signal to a lower frequency; a reception strength sensor section sensing a signal strength of the radio frequency signal; and an intermediate frequency signal processor section converting a signal from the radio frequency signal processor section to an even lower frequency, the intermediate frequency signal processor section including an Intermediate Frequency (IF) oscillator and a IF mixer circuit mixing a signal from the IF oscillator with a signal from the radio frequency signal processor section, said method comprising:
suspending power supply to the IF mixer circuit in the intermediate frequency signal processor section while a result of the sensing by the reception strength sensor section does not meet a predetermined condition; and starting power supply to the IF mixer circuit in the intermediate frequency signal processor section when the result of the sensing comes to meet the predetermined condition.

* * * * *